US009007128B2

(12) United States Patent
Gupta

(10) Patent No.: US 9,007,128 B2
(45) Date of Patent: Apr. 14, 2015

(54) METHOD AND APPARATUS FOR POWER AMPLIFIER LINEARIZATION

(75) Inventor: Dev V. Gupta, Concord, MA (US)

(73) Assignee: Newlans, Inc., Acton, MA (US)

( * ) Notice: Subject to any disclaimer, the term of this patent is extended or adjusted under 35 U.S.C. 154(b) by 55 days.

(21) Appl. No.: 13/882,933

(22) PCT Filed: Nov. 1, 2011

(86) PCT No.: PCT/US2011/058785
§ 371 (c)(1),
(2), (4) Date: Jul. 23, 2013

(87) PCT Pub. No.: WO2012/061385
PCT Pub. Date: May 10, 2012

(65) Prior Publication Data
US 2013/0293308 A1  Nov. 7, 2013

Related U.S. Application Data

(60) Provisional application No. 61/408,797, filed on Nov. 1, 2010.

(51) Int. Cl.
*H03F 1/08* (2006.01)
*H03F 3/21* (2006.01)
*H03F 1/32* (2006.01)
(Continued)

(52) U.S. Cl.
CPC ............ *H03F 3/211* (2013.01); *H03F 1/3229* (2013.01); *H03F 3/195* (2013.01); *H03F 3/245* (2013.01); *H03F 3/45188* (2013.01);
(Continued)

(58) Field of Classification Search
USPC ...................................... 330/293, 149, 83, 85
IPC ......................................................... H03F 1/08
See application file for complete search history.

(56) References Cited

U.S. PATENT DOCUMENTS 3,434,060 A  3/1969  Painter et al.
3,550,116 A * 12/1970  Kiyasu et al. ................. 341/159
(Continued)

FOREIGN PATENT DOCUMENTS

CN  1172558 A  2/1998
CN  1509534 A  6/2004
(Continued)

OTHER PUBLICATIONS

Notification of Transmittal of the International Search Report and the Written Opinion of the International Searching Authority, or the Declaration for PCT/US2013/057996, "Bi-Quad Calibration", mailed Dec. 26, 2013.
(Continued)

*Primary Examiner* — Patricia T Nguyen
(74) *Attorney, Agent, or Firm* — Knobbe, Martens, Olson & Bear, LLP

(57) ABSTRACT

In an embodiment, a circuit includes a variable group delay configured to delay a wideband input signal to obtain a delayed input signal; a wideband operational amplifier configured to determine an error signal based on a difference between the delayed input signal and a linearized power amplifier output; a feedback amplifier configured to amplify the error signal to obtain an amplified error signal; and a directional combiner configured to combine the amplified error signal with the power amplifier output to obtain the linearized power amplifier output.

20 Claims, 7 Drawing Sheets

(51) Int. Cl.
*H03F 3/195* (2006.01)
*H03F 3/24* (2006.01)
*H03F 3/45* (2006.01)

(52) U.S. Cl.
CPC .................... *H03F 2200/405* (2013.01); *H03F 2203/45644* (2013.01); *H03F 2203/45684* (2013.01)

(56) References Cited

U.S. PATENT DOCUMENTS

| | | | |
|---|---|---|---|
| 3,978,416 A | | 8/1976 | Sutphin, Jr. |
| 4,086,539 A | | 4/1978 | Gustafson et al. |
| 4,179,665 A | | 12/1979 | Gregorian |
| 4,507,791 A | | 3/1985 | Gundry |
| 5,144,258 A | | 9/1992 | Nakanishi et al. |
| 5,157,346 A | * | 10/1992 | Powell et al. ................. 330/151 |
| 5,325,204 A | | 6/1994 | Scarpa |
| 5,574,678 A | | 11/1996 | Gorecki |
| 5,959,871 A | | 9/1999 | Pierzchala et al. |
| 6,118,794 A | | 9/2000 | Cornfield et al. |
| 6,359,507 B1 | | 3/2002 | Myer |
| 6,424,209 B1 | | 7/2002 | Gorecki et al. |
| 6,593,812 B2 | * | 7/2003 | Sundstrom .................... 330/136 |
| 6,677,876 B1 | | 1/2004 | Hoggarth et al. |
| 6,765,377 B1 | | 7/2004 | Lu |
| 6,774,719 B1 | | 8/2004 | Wessel et al. |
| 6,919,763 B2 | * | 7/2005 | Boscolo et al. ............... 330/146 |
| 6,937,175 B1 | * | 8/2005 | Cruz-Albrecht et al. ..... 341/143 |
| 7,158,591 B2 | | 1/2007 | Harris |
| 7,733,950 B2 | | 6/2010 | Ko |
| 8,483,626 B2 | | 7/2013 | Gupta |
| 8,779,832 B2 | | 7/2014 | Gupta |
| 8,866,531 B2 | | 10/2014 | Gupta et al. |
| 2001/0041957 A1 | | 11/2001 | McCann et al. |
| 2002/0114270 A1 | | 8/2002 | Pierzga et al. |
| 2002/0196876 A1 | | 12/2002 | Takada |
| 2003/0076907 A1 | | 4/2003 | Harris |
| 2003/0155922 A1 | | 8/2003 | Royle et al. |
| 2004/0021594 A1 | | 2/2004 | Melanson |
| 2005/0038847 A1 | | 2/2005 | Cheng et al. |
| 2005/0052226 A1 | | 3/2005 | Doerrer |
| 2005/0077960 A1 | | 4/2005 | Kim et al. |
| 2005/0130609 A1 | | 6/2005 | Nagode et al. |
| 2005/0266805 A1 | | 12/2005 | Jensen |
| 2005/0275577 A1 | | 12/2005 | Bjornsen |
| 2006/0092057 A1 | | 5/2006 | Slavin |
| 2006/0158247 A1 | | 7/2006 | Lee |
| 2006/0186995 A1 | | 8/2006 | Wu et al. |
| 2006/0261846 A1 | | 11/2006 | Twigg et al. |
| 2006/0284687 A1 | | 12/2006 | Abel |
| 2007/0146071 A1 | | 6/2007 | Wu |
| 2007/0286264 A1 | | 12/2007 | Kontola et al. |
| 2009/0184769 A1 | | 7/2009 | Lee et al. |
| 2011/0051782 A1 | | 3/2011 | Gupta et al. |
| 2012/0249093 A1 | * | 10/2012 | Grbo et al. .................... 323/234 |
| 2013/0106487 A1 | | 5/2013 | Gupta |
| 2013/0293264 A1 | | 11/2013 | Gupta |
| 2014/0306777 A1 | | 10/2014 | Gupta |

FOREIGN PATENT DOCUMENTS

| | | |
|---|---|---|
| CN | 101053160 A | 10/2007 |
| EP | 0579875 A1 | 1/1994 |
| GB | 2296165 B | 12/1999 |
| GB | 2 439 116 A | 12/2007 |
| JP | 2007-058596 A | 3/1995 |
| JP | 2007-240664 A | 9/1995 |
| JP | 2008-122408 A | 5/2008 |
| JP | 2011-526428 | 10/2011 |
| WO | WO 02/095990 A1 | 11/2002 |
| WO | WO 2006-131565 A1 | 12/2006 |
| WO | WO 2009/114123 A2 | 9/2009 |
| WO | WO 2011/152896 A1 | 12/2011 |
| WO | WO 2012/064551 A2 | 5/2012 |

OTHER PUBLICATIONS

Franco, Sergio, "State-Variable and Biquad Filters" (Jan. 1, 1988), In *Design With Operational Amplifiers and Analog Integrated Circuits*, (McGraw-Hill Book Company), pp. 136-145, XP009153311.

Notification Concerning Transmittal of International Preliminary Report on Patentability for Int'l Application No. PCT/US2009/001512, "Method, System, and Apparatus for Wideband Signal Processing," Date Mailed: Sep. 23, 2010.

Notification Concerning Transmittal of International Preliminary Report on Patentability PCT/US2011/058785 "Method and Apparatus for Power Amplifier Linearization," Date of Mailing , May 16, 2013.

Notification Concerning Transmittal of International Preliminary Report on Patentability PCT/US2011/058786 "Field-Programmable Arnakg Array" Date of Mailing, May 23, 2013.

Notification of Transmittal of the international Search Report and the Written Opinion of the International Searching Authority, or the Declaration for PCT/US2012/062965, "Wideband Signal Processing," mailed Feb. 26, 2013.

Notification of Transmittal of the International Search Report and the Written Opinion of the international Searching Authority, or the Declaration for PCT/US2009/001512, "Method, System, and Apparatus for Wideband Signal Processing," mailed Oct. 20, 2009.

Supplementary European Search Report, Application No. EP 09721007, "Method, System, and Apparatus for Wideband Signal Processing," dated Nov. 17, 2011.

Notification of Transmittal of the International Search Report and the Written Opinion of the International Searching Authority, of the Declaration, PCT/US2011/024542, "Broadband Analog Radio-Frequency Components," Date Mailed: Oct. 31, 2011.

International Preliminary Report on Patentability, International Application No. PCT/US2011/024542, "Broadband Analog Radio-Frequency Components," Date Mailed: Aug. 23, 2012.

International Search Report and Written Opinion of the International Searching Authority mailed Jun. 29, 2012 from International Application No. PCT/US2011/058786, Field Programmable Analog Array, filed Nov. 1, 2011.

S.P. et al. "A Transmitter IC for TETRA Systems Based on a Cartesian Feedback Loop Linearization Technique", In: IEEE Journal of Solid-State Circuits, vol. 40, No. 3, Mar. 2005, pp. 707-718.

C.J.S. et al. "A New Adaptive Double Envelope Feedback (ADEF) Linearizer for Mobile Radio Power Amplifiers", In: IEEE MIT-S International Microwave Symposium Digest, 1994, pp. 573-576.

International Search Report and Written Opinion of the International Searching Authority mailed Feb. 9, 2012 from International Application No. PCT/US2011/058785 filed Nov. 1, 2011.

Notification Concerning Transmittal of International Preliminary Report on Patentability, International Application No. PCT/US2012/062965, "Wideband Signal Processing," date mailed, May 15, 2014.

Notice of Allowance in U.S. Appl. No. 12/921,987, dated May 7, 2014.

Notice of Allowance in U.S. Appl. No. 13/576,635, dated Jul. 11, 2014.

Supplementary European Search Report, Application No. EP 11790125, "Broadband Analog Radio-Frequency Components," date May 12, 2014.

* cited by examiner

METHOD AND APPARATUS FOR POWER AMPLIFIER LINEARIZATION

RELATED APPLICATION

This application is the U.S. National Stage of International Application No. PCT/US2011/058785, filed Nov. 1, 2011, which designates the U.S., published in English, and claims the benefit of U.S. Provisional Application No. 61/408,797, filed on Nov. 1, 2010. The entire teachings of the above applications are incorporated herein by reference.

BACKGROUND

A significant shortcoming of RF power amplifiers is the degree of nonlinear distortion they introduce into the amplified signal. This occurs when the amplifier operates outside of its linear region and limits the power efficiency of the amplifier.

SUMMARY

Embodiments of the present invention include a circuit and corresponding method for linearizing the output of a power amplifier using feedback. Typically, the power amplifier operates on one copy of a wideband input signal. A variable group delay block delays another copy of the wideband input signal to obtain a delayed input signal, which is coupled to the non-inverting input of a wideband operational amplifier (op-amp). The op-amp is coupled in a feedback loop to determine an error signal based on a difference between the delayed input signal and the (linearized) power amplifier output. A feedback amplifier amplifies the error signal to obtain an amplified error signal, which is combined with the power amplifier output to obtain a linearized power amplifier output using a directional combiner.

In some examples, the feedback amplifier may include or be coupled to an additional linearization circuit (e.g., in recursive fashion). The additional linearization circuit includes another variable group delay block, which delays the error signal from the wideband op-amp to obtain a delayed error signal. A second wideband op-amp determines a second error signal based on a difference between the delayed error signal and the amplified error signal (i.e., the output of the feedback amplifier). A second feedback amplifier amplifies the second error signal to obtain a second amplified error signal, which is combined with the output of the first feedback amplifier to obtain the amplified error signal using another directional combiner.

Example circuits can be integrated circuits fabricated using deep sub-micron CMOS technology, including 130 nm, 65 nm, and 45 nm CMOS technology.

In an embodiment, a circuit includes a variable group delay configured to delay a wideband input signal to obtain a delayed input signal; a wideband operational amplifier configured to determine an error signal based on a difference between the delayed input signal and a linearized power amplifier output; a feedback amplifier configured to amplify the error signal to obtain an amplified error signal; and a directional combiner configured to combine the amplified error signal with the power amplifier output to obtain the linearized power amplifier output.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
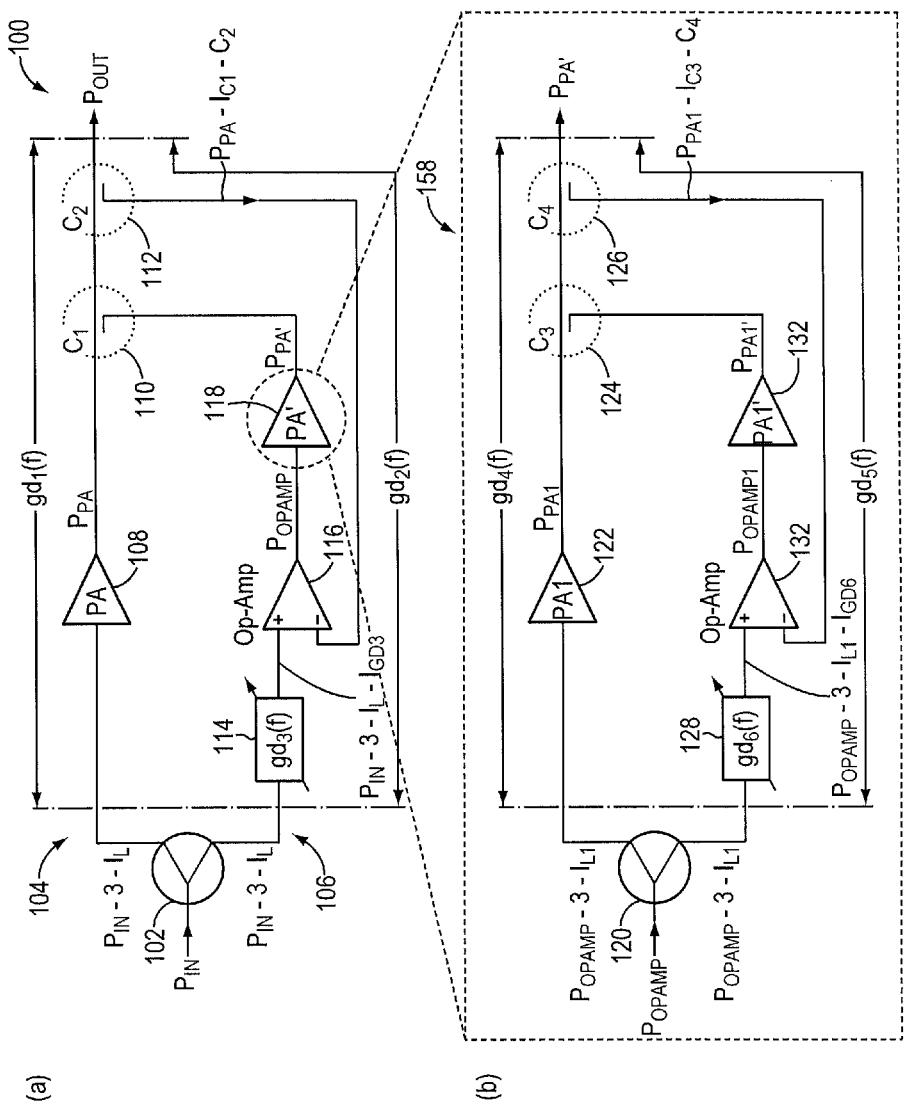
FIG. 1A is a block diagram of a linearization circuit for a power amplifier.
FIG. 1B is a block diagram of the feedback power amplifier shown in FIG. 1A.
Figure 2:
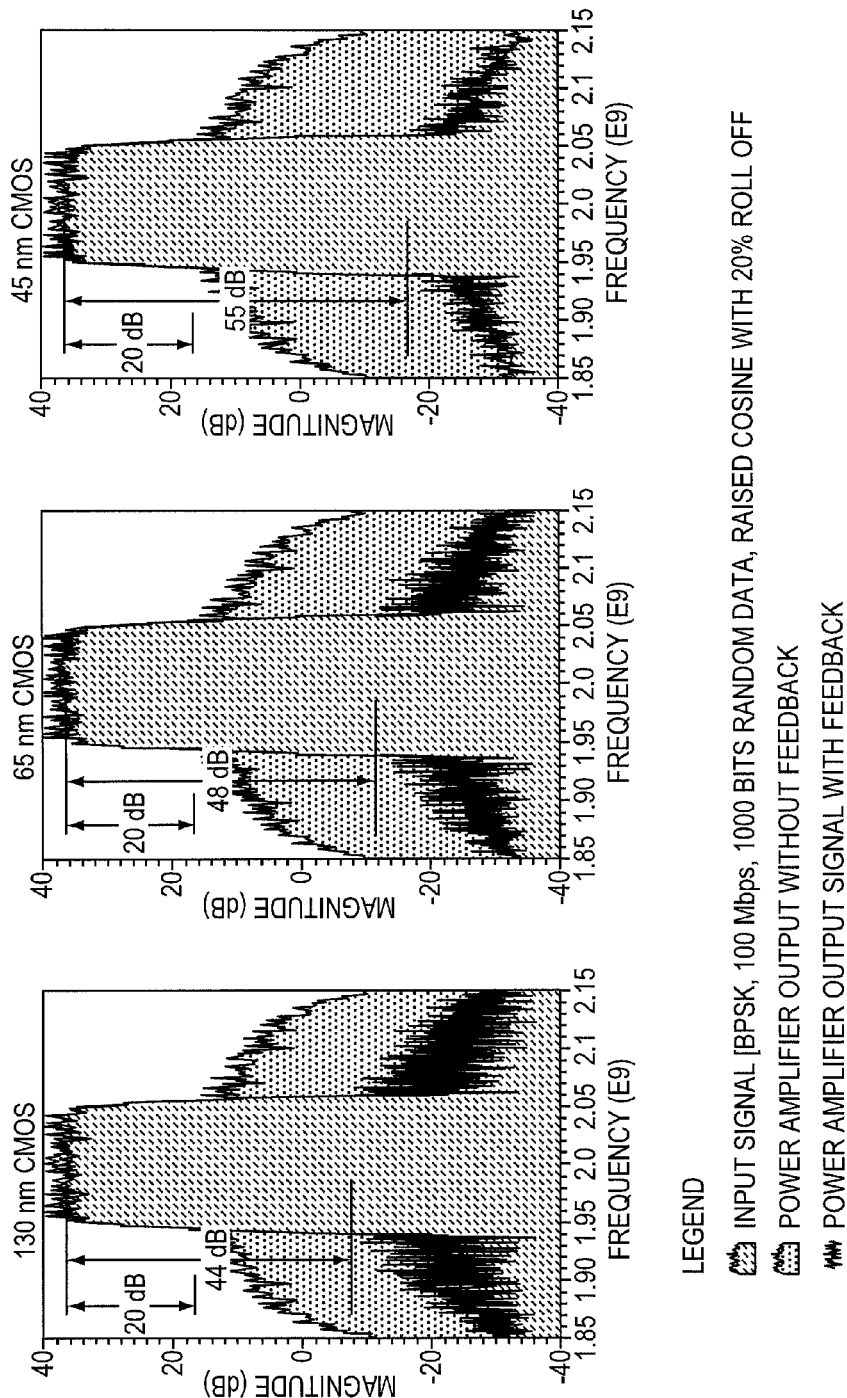
FIG. 2 shows plots of Cadence® simulations of linearization of a power amplifier using the circuit depicted in FIGS. 1A and 1B.

FIG. 1A is a block diagram of an integrated circuit (IC) 100 that linearizes a wideband power amplifier 108. The circuit output is an amplified output signal $P_{OUT}$ that may be distorted due to the power amplifier's nonlinear behavior. For example, the power amplifier's nonlinear behavior may cause the output signal $P_{OUT}$ to spill out the spectrum skirt of the input signal $P_{IN}$, as shown in FIG. 2 (described below).

A splitter 102 at the input to the IC 100 splits an input signal $P_{IN}$ evenly between a top path 104 and a bottom path 106, causing a loss of $(3 \text{ dB} + I_L)$ where $I_L$ is the insertion loss of the splitter 102. The top path 104, which includes the power amplifier 108, has a group delay of $gd_1(f)$, and the bottom path 106 has a group delay of $gd_2(f)$. The top path 104 also includes two directional couplers 110 and 112 with coupling values of $C_1$ and $C_2$ dB. The first directional coupler 110 combines the power amplifier output with the output of a feedback power amplifier 118 in the second path 106, and the second directional coupler 112 couples a fraction of the output signal $P_{OUT}$ to the inverting input of a wideband op-amp 116 in the bottom path 106. The insertion losses of the directional couplers 110 and 112 are $I_{C_1}$ and $I_{C_2}$ dB respectively.

The bottom path 106 serves to generate a compensation (feedback) term for the distortion (nonlinearities) introduced by the power amplifier 108 into the output signal $P_{OUT}$. As stated above, the group delay of the signal through the power amplifier 108 and directional couplers 110 and 112 is $gd_1(f)$, whereas $gd_2(f)$ is the group delay of the amplified signal coupled from the second directional coupler 112. The bottom path 106 feeds the input signal $P_{IN}$ from the splitter 102 into a tunable group delay $gd_3(f)$ 114, which is dynamically adjusted such that $gd_2(f)$ is equal to $gd_1(f)$. The group delay $gd_3(f)$ has an insertion loss of $I_{GD3}$ dB.

The output from the tunable group delay 114 is fed to the non-inverting input of the wideband op-amp 116. The inverting input of the op-amp 116 is the coupled output power $(P_{PA} - I_{C_1} - C_2)$ dB from the power amplifier 108. The output of the op-amp is an error signal $P_{OPAMP}$ equal to the difference between the two input signals. A feedback power amplifier $(PA' - C_1)$ dB 118 amplifies the error signal $P_{OPAMP}$ such that the amplified error signal $P_{PA'}$ is equal to the power level of the distorted output signal from the power amplifier 108 less the insertion loss of the first directional coupler 110. The first directional coupler 110 combines the amplified signal from the power amplifier 108 with the amplified error signal $P_{P4'}$ from the feedback amplifier 118 to cancel the distortion from the output of the power amplifier 108. The output signal $P_{OUT}=P_{P4}-I_{C1}-I_{C2}$, where $P_{P4}=P_{IN}-3\,dB-I_L+G_{P4}$ and $G_{P4}$ is the gain of the power amplifier 108 in dB.

FIG. 1B shows a circuit 158 that can be used instead of the feedback power amplifier 118 shown in FIG. 1A for situations requiring greater amplification of the error signal $P_{OPAMP}$. In essence, the circuit 158 shown in FIG. 1B linearizes a power amplifier 122 that amplifies the error signal $P_{OPAMP}$ as described above. A splitter 120 directs part of the error signal $P_{OPAMP}$ to the power amplifier 122 and another part to a variable group delay 128, which compensates for changes in the group delay of the power amplifier 122 and its associated directional couplers 124 and 126. A wideband op-amp 130 subtracts the output of the second directional coupler 126 from the output of the variable group delay 128 to produce an error signal $P_{OPAMP\,1}$, which is amplified with another feedback amplifier 132. Generally speaking, the amplified error signal $P_{P4'1}$ is at a power level that is sufficiently low (e.g., 4 dBm) to be well within the other feedback amplifier's linear range. If not, then the other feedback amplifier 132 can be linearized using a circuit similar to circuits 100 and 158.

FIG. 2 shows a set of Cadence® simulation results for three integrated circuits for linearizing power amplifiers fabricated 130 nm (left), 65 nm (middle), and 45 nm (right) CMOS technology. The pink spectrum is the input signal (in this case, a binary phase shift key (BPSK), 100 Mbps, 1000 random bits, raised cosine pulse with 20% roll-off). Without feedback linearization, the power amplifier output is shown in red, only 20 dB down from the input signal. With feedback linearization, the power amplifier output is 44, 48, and 55 dB down for the 130, 65, and 45 nm nodes respectively.

Figure 3:
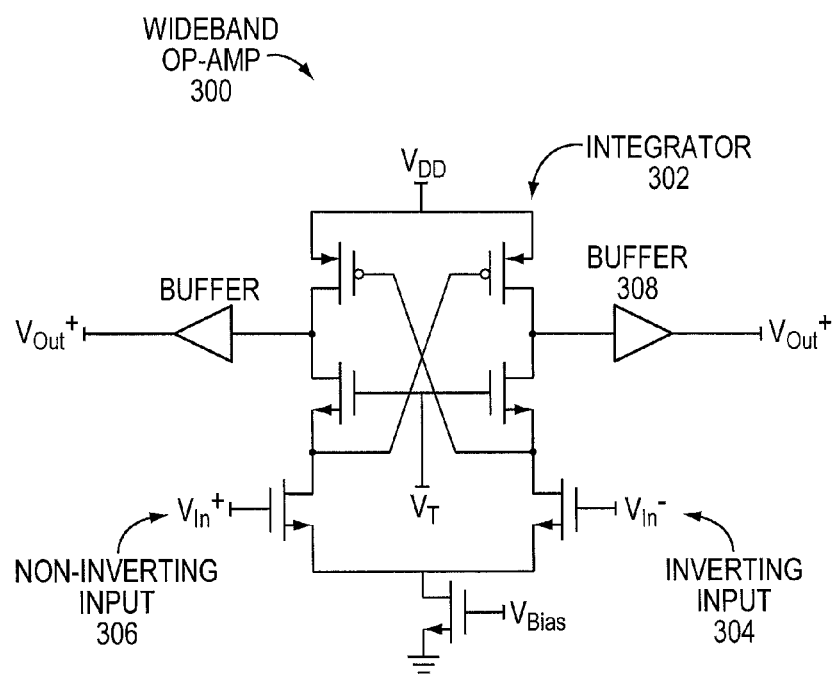
FIG. 3 is a circuit diagram of a wideband op-amp suitable for use in the circuits shown in FIGS. 1A and 1B.

FIG. 3 shows a wideband (e.g., up to 200 GHz) op-amp 300 suitable for use in the linearization circuits 100 and 158 shown in FIGS. 1A and 1B. The op-amp includes a differential, feedforward integrator 302 that includes three pairs of field-effect transistors (FETs) connected in series between a voltage supply and ground. The gates of the lower pair of FETs act as the inverting and non-inverting inputs 304, 306 of the op-amp 300. A node between the top and middle FETs above the inverting input 304 provides an output that is filtered with a capacitor C and buffered with a buffer 308. The FETs in the middle of the op-amp 300 act as voltage-variable resistors and are controlled by a voltage $Y_R$ in the linear region. Changing $Y_R$ to about 1 V causes the gain to shift to almost 140 dB and the phase to shift to −90° at a few hundred kilohertz before dropping off at over 100 GHz. The field accuracy can be maintained all the way from a few hundred kilohertz out to 10 GHz.

Figure 4:
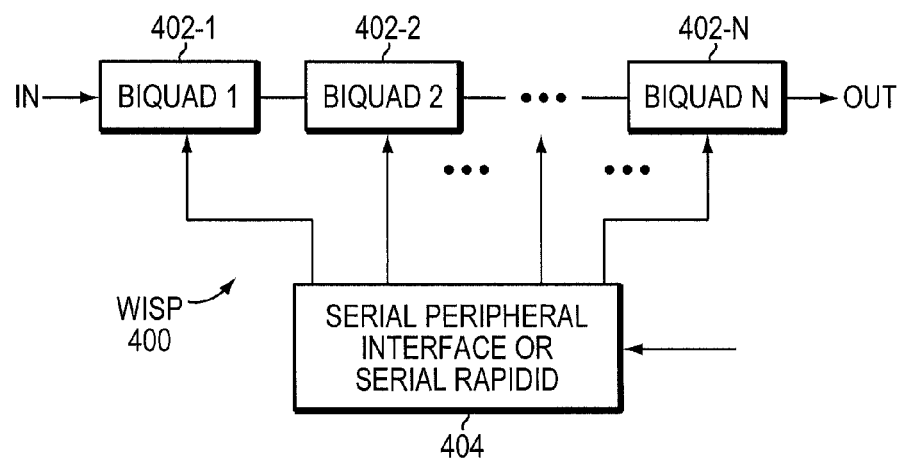
FIG. 4 is a block diagram of a wideband signal processor that can be provisioned to act as the variable group delays shown in FIGS. 1A and 1B.

FIG. 4 shows a wideband (analog) signal processor (WiSP) 400 that can be provisioned to act as a variable group delay block suitable for use in the linearization circuits 100 and 158 shown in FIGS. 1A and 1B. The WiSP 400 includes N biquad processors 402 that operate in series on an analog input to produce a delayed analog output. The provisioning is done digitally. Each biquad 402 may be implemented in the form of a second-order state variable filter, such the filters described in U.S. application Ser. No. 12/921,987 to Dev V. Gupta and Divi Gupta, incorporated herein by reference in its entirety. Additionally, the biquads of 402 may be implemented in the forms of FIGS. 5A, 5B, and 5C.

A serial peripheral interface or serial RapidIO interconnect 404 controls the biquads 402 to achieve the desired group delay. The interface/interconnect 404 may also respond to outside signals, e.g., signals that adjust the desired group delay based on mismatch between arms of the linearization circuits described above. For more on serial RapidIO, see www.rapidio.org/home, which is incorporated herein by reference in its entirety.

The WiSP 400 implements a variable group delay by changing attenuator, integrator, or tunable loss pad values within the biquad circuits 402, which make up a group delay network. Changes in the attenuator, integrator, or tunable loss pad values vary the WiSP's transfer function by changing the pole locations. This then varies the phase response, which has the effect of varying the group delay.

Figure 5A:
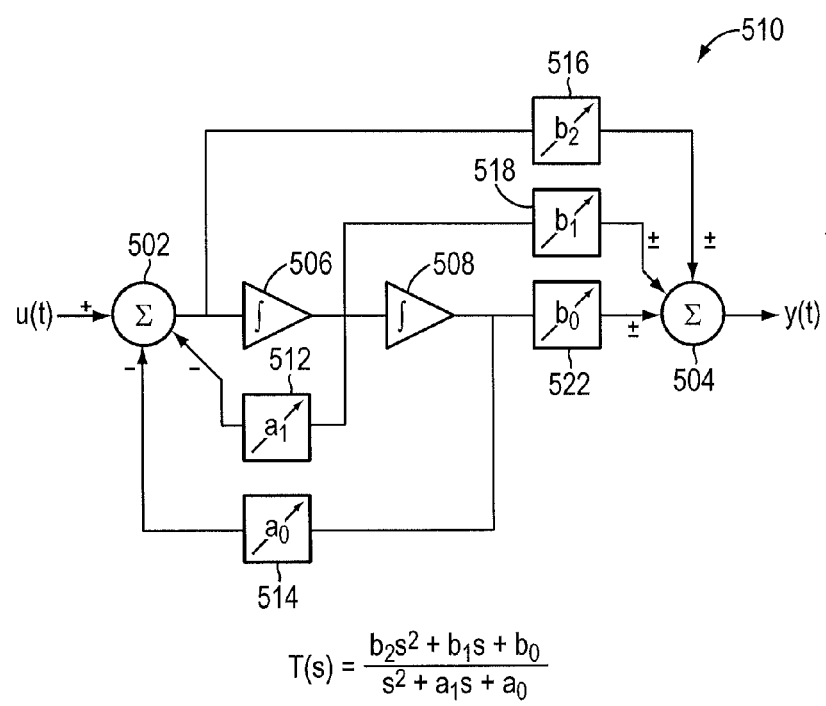
FIGS. 5A, 5B, and 5C are block diagrams of second-order state variable structures that can be used to implement the biquad structures within the wideband signal processor of FIG. 4.

FIG. 5A shows a second-order state variable structure 510 that comprises two integration/gain stages, with variable gain attenuators operating within each stage. A combined signal based on a wideband input u(t) is fed to the first integration/gain stage, which, in turn, provides an input to the second integration/gain stage. Variable gain attenuators feeds signals forward (b's) 516, 518, 522 and backward (a's) 512, 514 from the input and output of each of the two integrators 506, 508. These signals terminate in a first summing block 502 that combines feedback signals and second summing block 504 that combines feed-forward signals. Example second-order state variable filters may also include fractional gain blocks and additional summers. Varying gains of the variable gain blocks changes a center frequency of the embodiment second-order state variable filters. The transfer function coefficients of a wideband signal processing filter constructed from the structure of FIG. 5A are determined by the variable attenuator values.

Figure 5B:
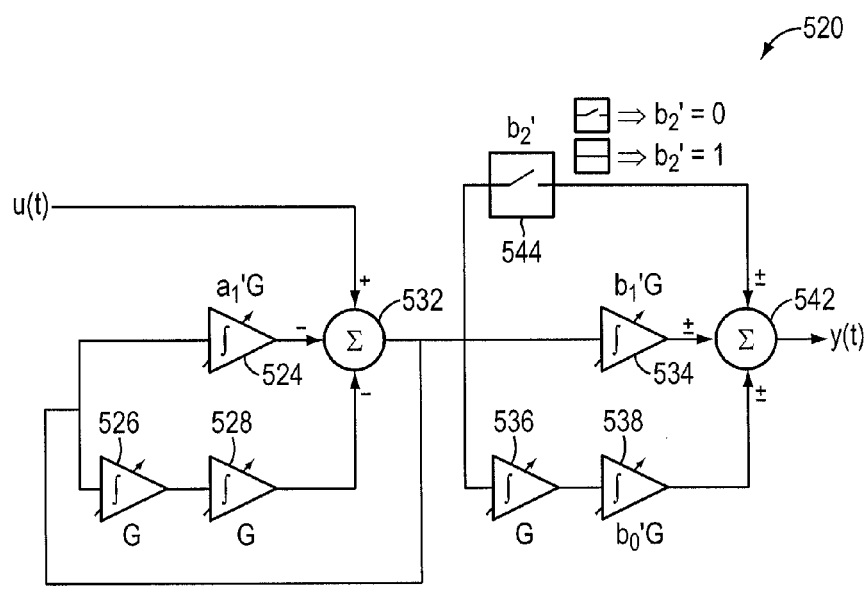

FIG. 5B shows a second-order state variable structure 520 that comprise two integration/gain stages, each of which includes three variable gain integrators 524, 526, 528, 534, 536, 538, two of which are operably coupled to a summing block 532, 542. A combined signal based on a wideband input u(t) is fed to the first integration/gain stage, which, in turn, provides an input to the second integration/gain stage. Each gain stage consists of an upper and lower path, with two variable integrators in the lower path and one in the upper path. A switch 544 operably couples a third, binary-valued signal to the second stage summing block 542. Example second-order state variable filters may also include fractional gain blocks and additional summers. Varying gains of the variable gain blocks changes a center frequency of the embodiment second-order state variable filters. The transfer function coefficients of a wideband signal processing filter constructed from the structure of FIG. 5B are determined by the integrator gain values.

Figure 5C:
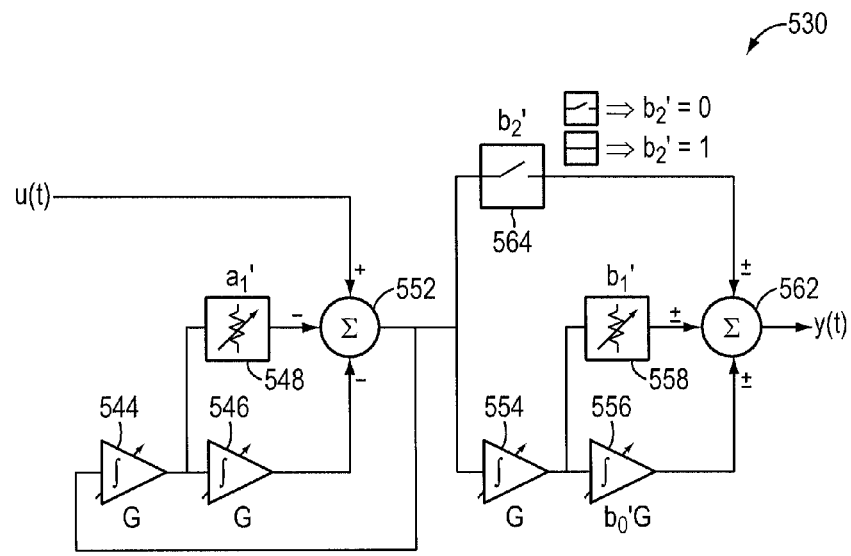

FIG. 5C shows a second-order state variable structure 530 that comprise two integration/gain stages, each of which includes one tunable loss pad 548, 558 and two integrators 544, 546, 554, 556, one of which is operably coupled to a summing block 552, 562. A combined signal based on a wideband input u(t) is fed to the first integration/gain stage, which, in turn, provides an input to the second integration/gain stage. Each gain stage consists of an upper and lower path, with two integrators in the lower path and one tunable loss pad in the upper path. A switch 564 operably couples a third, binary-valued signal to the second stage summing block 562. Example second-order state variable filters may also include fractional gain blocks and additional summers. Varying gains of the variable gain blocks changes a center frequency of the embodiment second-order state variable filters. The transfer function coefficients of a wideband signal processing filter constructed from the structure of FIG. 5C are determined by the tunable loss pads and integrator gain values.

What is claimed is:

1. A circuit comprising:
   a variable group delay configured to delay a wideband input signal to obtain a delayed input signal;
   a wideband operational amplifier configured to determine an error signal based on a difference between the delayed input signal and a linearized power amplifier output;
   a feedback amplifier configured to amplify the error signal to obtain an amplified error signal; and
   a directional combiner configured to combine the amplified error signal with a power amplifier output to obtain the linearized power amplifier output,
   wherein the feedback amplifier comprises:
      another variable group delay configured to delay the error signal to obtain a delayed error signal;
      another wideband operational amplifier configured to determine another error signal based on a difference between the delayed error signal and the amplified error signal;
      another feedback amplifier configured to amplify the another error signal to obtain another amplified error signal; and
      another directional combiner configured to combine the another amplified error signal with an output of the feedback amplifier to obtain the amplified error signal.

2. The circuit of claim 1 comprising an integrated circuit fabricated using deep sub-micron CMOS technology.

3. The circuit of claim 1 in combination with a power amplifier.

4. A method of linearizing the output of a power amplifier, the method comprising:
   delaying a wideband input signal to obtain a delayed input signal;
   determining an error signal based on a difference between the delayed input signal and a linearized power amplifier output;
   amplifying the error signal to obtain an amplified error signal; and
   combining the amplified error signal with the power amplifier output to obtain the linearized power amplifier output, wherein amplifying the error signal comprises:
   delaying the error signal to obtain a delayed error signal;
   determining another error signal based on a difference between the delayed error signal and the amplified error signal;
   amplifying the another error signal to obtain another amplified error signal; and
   combining the another amplified error signal with an output of the feedback amplifier to obtain the amplified error signal.

5. The method of claim 4 further including amplifying the input signal.

6. The circuit of claim 1, wherein the wideband operational amplifier includes a first input configured to receive the delayed input signal.

7. The circuit of claim 6, further comprising a directional coupler, wherein the wideband operational amplifier includes a second input configured to receive a coupled signal generated by the directional coupler.

8. The circuit of claim 7, further comprising a splitter configured to split an input signal to generate the wideband input signal and a power amplifier input signal.

9. The circuit of claim 8, further comprising a power amplifier configured to receive the power amplifier input signal and to generate the power amplifier output.

10. The circuit of claim 1, wherein the variable group delay comprises a wideband signal processor.

11. The circuit of claim 10, wherein the wideband signal processor comprises a plurality of biquad processors arranged in series.

12. The circuit of claim 11, further comprising a serial peripheral interface configured to control a group delay of the plurality of biquad processors.

13. The circuit of claim 1, wherein the wideband operational amplifier comprises a plurality of field effect transistors.

14. The method of claim 4, further comprising receiving the delayed input signal at a first input of a wideband operational amplifier.

15. The method of claim 14, further comprising generating a coupled signal using a directional coupler, and receiving the coupled signal at a second input of the wideband operational amplifier.

16. The method of claim 15, further comprising determining the error signal based on amplifying a difference between the delayed input signal and the coupled signal using the wideband operational amplifier.

17. The method of claim 14, further comprising splitting an input signal to generate the wideband input signal and a power amplifier input signal.

18. The method of claim 17, further comprising generating the power amplifier output by amplifying the power amplifier input signal.

19. The method of claim 4, wherein delaying the wideband input signal comprises providing delay using a wideband signal processor.

20. The method of claim 19, further comprising controlling a group delay of a plurality of biquad processors of the wideband signal processor.

* * * * *